United States Patent
Sakuma et al.

(10) Patent No.: US 8,057,705 B2
(45) Date of Patent: Nov. 15, 2011

(54) SIALON PHOSPHOR

(75) Inventors: Ken Sakuma, Sakura (JP); Naoto Hirosaki, Tsukuba (JP)

(73) Assignees: Fujikura Ltd., Tokyo (JP); National Institute for Materials Science, Ibaraki (JP)

( * ) Notice: Subject to any disclaimer, the term of this patent is extended or adjusted under 35 U.S.C. 154(b) by 69 days.

(21) Appl. No.: 12/561,821

(22) Filed: Sep. 17, 2009

(65) Prior Publication Data

US 2010/0072881 A1  Mar. 25, 2010

Related U.S. Application Data

(63) Continuation of application No. PCT/JP2008/052869, filed on Feb. 20, 2008.

(30) Foreign Application Priority Data

Mar. 22, 2007 (JP) ................................. 2007-074657

(51) Int. Cl.
*C09K 11/80* (2006.01)
*H01L 33/00* (2010.01)
(52) U.S. Cl. ................. 252/301.4 F; 313/503; 313/486; 257/98

(58) Field of Classification Search ............ 252/301.4 F; 313/503; 257/98
See application file for complete search history.

(56) References Cited

U.S. PATENT DOCUMENTS

| | | | |
|---|---|---|---|
| 7,825,580 B2 * | 11/2010 | Hirosaki et al. | 313/503 |
| 2006/0061263 A1 * | 3/2006 | Sakuma et al. | 313/503 |

FOREIGN PATENT DOCUMENTS

| | | | |
|---|---|---|---|
| JP | 2002-363554 A | | 12/2002 |
| JP | 2003-124527 A | | 4/2003 |
| JP | 2006-52337 | * | 2/2006 |
| JP | 2006-152069 A | | 6/2006 |
| JP | 2006-232868 A | | 9/2006 |
| WO | 2006/006582 A1 | | 1/2006 |
| WO | 2006/025261 A1 | | 3/2006 |
| WO | WO 2007/004492 | * | 1/2007 |

OTHER PUBLICATIONS

R-J. Xie et al. "$Eu^{2+}$-doped Ca-α-SiAlON: A yellow phosphor for white light-emitting diodes", Applied Physics Letters, vol. 84, No. 26, pp. 5404-5406 (2004).

* cited by examiner

*Primary Examiner* — Carol M Koslow
(74) *Attorney, Agent, or Firm* — Sughrue Mion, PLLC

(57) ABSTRACT

A SiAlON phosphor represented by a general formula (1)

$$Lu_p(Si, Al)_{12}(O, N)_{16}:Eu_q \qquad (1)$$

wherein at least a main phase has an alpha SiAlON crystal structure; and $0.25 \leq p \leq 0.65$.

6 Claims, 6 Drawing Sheets

SIALON PHOSPHOR

TECHNICAL FIELD

The present invention relates to a SiAlON phosphor which is brighter and emits light at a long-wavelength side compared to conventional ones, the SiAlON phosphor also capable of being suitably used for white light emitting diode lamps and the like. The present invention also relates to a light emitting device using the above SiAlON phosphor.

This application is a Continuation Application of International Patent Application No. PCT/JP2008/052869, filed on Feb. 20, 2008, which claims priority from Japanese Patent Application, No. 2007-074657, filed on Mar. 22, 2007, the contents of which are incorporated herein by reference.

BACKGROUND ART

In the field of illumination, there is more and more expectation on solid state lighting applications, in particular, on white illumination using semiconductor light emitting diode, leading to a widespread, vigorous, and continuous research and development. Although white light emitting diode lamp has already achieved an emission efficiency greater than or equivalent to an incandescent light bulb, there is room for further improvement, and it is considered that the white light emitting diode lamp will become widespread in the near future as an energy saving illumination device. In addition, white light emitting diode lamp is substantially advantageous in that the white light emitting diode lamp does not include substances such as mercury which impose a heavy burden on the environment. Because the dimension of an element of the white light emitting diode lamp is small, the white light emitting diode lamp is frequently used by being incorporated into a backlight of a liquid crystal displaying device and a cellular phone and the like. A white light emitting diode used in this white light emitting diode lamp includes a light emitting diode element that emits a short wavelength light such as a blue light; and a fluorescent substance that is excited by absorbing a part of or all of this light and emits a fluorescent light with a longer wavelength such as a yellow light. In other words, white light is obtained by mixing a blue light emitted by a blue light emitting diode as a light source and a yellow light emitted by a phosphor.

Concerning light emitting devices used for illumination, white light emitting devices with various color temperatures are demanded according to their usage. In order to meet such demands, a phosphor that provides a much wider chromaticity range compared to known phosphors, and a technology for adjusting the chromaticity are in demand.

For example, Japanese Unexamined Patent Application, First Publication No. 2002-363554 (corresponding patent: Japanese Patent No. 3668770) (Patent Document 1) discloses a phosphor such that, if a general formula is $Me_xSi_{12-(m+n)}Al_{(m+n)}O_nN_{16-n}$, Me is Ca, Mg, Y; or a lanthanide metal excluding La and Ce; and Ce, Pr, Eu, Tb, Yb, and Er which are emission center lanthanide metals replacing a part of it; and a Dy as its coactivator. Regarding this phosphor, a composition range is disclosed such that, when the metal Me is divalent, $0.6<m<3.0$ and $0\leq n<1.5$; and when the metal Me is trivalent, $0.9<m<4.5$ and $0\leq n<1.5$. It is also disclosed that, the peak emission wavelength can be continuously varied in the range of 560 nm to 590 nm by changing the activator amount of the $Eu^{2+}$ ion. A phosphor disclosed in Japanese Unexamined Patent Application, First Publication No. 2003-124527 (Patent Document 2) achieves a dominant wavelength in the range of 546 nm to 583 nm by being activated by $Eu^{2+}$ and having Ca as a main component of metal. In PCT International Publication No. WO 2006/006582 (Patent Document 3), we disclosed a phosphor having a dominant wavelength in the range of 577.7~583.1 nm by being activated by $Eu^{2+}$ and by having Ca as a main component of metal. However, presently there is a demand for a phosphor that can be excited by a blue light and emits light at a much longer wavelength compared to the above disclosed phosphors.

DISCLOSURE OF THE INVENTION

Problems to be Solved by the Invention

In order to solve the above problem, Xie et al., for example, in "R-J. Xie et al., '$Eu^{2+}$-doped Ca-α-SiAlON: A yellow phosphor for white light-emitting diodes,' Applied Physics Letters, Vol. 84, Number 26, pp. 5404-5406 (2004)" (Non-Patent Document 1), discloses a phosphor with chromaticity coordinates (x, y) from (0.491, 0.497) to (0.560, 0.436) on CIE1931 chromaticity diagram. This corresponds to a dominant wavelength in the range of 578 nm to 588 nm. However, the phosphor disclosed by Xie et al. requires the use of an expensive rare earth nitride as a starting material, and there was a demand for a technology that provides a long-wavelength light emitting phosphor inexpensively.

In order to solve this problem, we have disclosed in PCT International Publication No. WO 2006/025261 (Patent Document 4), a novel phosphor (Ca,Y)-α-SiAlON:Eu. These phosphors achieved a dominant wavelength of 580.2~590.7 nm. However, these phosphors had a problem such that, the emission intensity decreases rapidly as the amount of replacement from Ca to Y increases and as the emission wavelength becomes longer.

Therefore, an object of the present invention is to provide a SiAlON phosphor that can be produced inexpensively without using expensive nitride starting materials, has an emission chromaticity with a longer wavelength and brightness compared to conventional phosphors, and does not cause a sudden drop in the emission intensity at a long-wavelength side.

In addition, the present invention aims to provide a light emitting device using the SiAlON phosphor.

Means for Solving the Problems

In order to achieve the above objectives, the present inventors conducted an acute analysis and focused on a phosphor Lu-α-SiAlON:Eu. Although it has been implied that the phosphor Lu-α-SiAlON:Eu can be synthesized, there has been no disclosure of technical details such as its most appropriate composition range or its optical characteristics. The present inventors completed the present invention by synthesizing the novel phosphor, analyzing its characteristics, and as a result, discovering that the dominant wavelength is at a long-wavelength side compared to conventional ones, the peak emission intensity is strong, and that the peak emission intensity hardly decreases even though the dominant wavelength becomes a longer wavelength.

The SiAlON phosphor according to the present invention has a composition represented by a general formula (1)

$$Lu_p(Si, Al)_{12}(O, N)_{16}:Eu_q \qquad (1)$$

wherein a main phase has an alpha SiAlON crystal structure, and $0.25 \leq p \leq 0.65$.

According to the SiAlON phosphor, q can be in a range of $0.03 \leq q \leq 0.08$.

In addition, the SiAlON phosphor according to the present invention may be configured as follows: the general formula (1) is represented by a general formula (2).

$$Lu_p Si_{12-(m+n)} Al_{(m+n)} O_n N_{16-n} : Eu_q \quad (2)$$

(Here, when p+q is represented as k, m is a value represented by 3×k, and n is a value represented by (3×k)/2.)

In addition, the SiAlON phosphor may be configured as follows: p is in the range of $0.25 \leq p \leq 0.35$.

The SiAlON phosphor may be configured as follows: p is in the range of $0.30 \leq p \leq 0.65$.

In addition, the present invention provides a light emitting device including said SiAlON phosphor and a semiconductor blue light emitting diode element.

Effects of the Invention

The SiAlON phosphor according to the present invention is excited with an ultra violet light or a blue light, and emits a fluorescent light from yellow to orange. The SiAlON phosphor according to the present invention can be produced inexpensively without using expensive nitride starting materials, has an emission chromaticity with a longer wavelength and brightness compared to conventional phosphors, and has an excellent characteristic such that the emission intensity does not drop suddenly at a long-wavelength side. Therefore, said SiAlON phosphor can be used for white light emitting diode lamp and the like which uses a blue semiconductor light emitting element.

BEST MODE FOR CARRYING OUT THE INVENTION

The SiAlON phosphor according to the present invention is activated by europium (Eu), lutetium (Lu) is doped, and has a composition and structure represented in detail by a general formula (1) and in further detail by a general formula (2).

$$Lu_p(Si, Al)_{12}(O, N)_{16} : Eu_q \quad (1)$$

$$Lu_p Si_{12-(m+n)} Al_{(m+n)} O_n N_{16-n} : Eu_q \quad (2)$$

The general formulae (1) and (2) are represented by using an atomic ratio. Regarding general formulae (1) and (2), p and q represent the amount of Lu and Eu respectively, when the total amount of silicon (Si) and Al is 12, and when the total amount of O and N is 16 in atomic ratio. It is preferred that p is at least 0.25, and less than or equal to 0.65. It is preferred that q is at least 0.03, and less than or equal to 0.08.

Next, an explanation is provided regarding the ratio of a solid solution element. An alpha SiAlON is structured so that a portion of an Si—N bond of an alpha silicon nitride is replaced by an Al—N bond or an Al—O bond, and is stabilized by a metal element forming an interstitial solid solution in a crystal lattice. An emission center Eu does not form a solid solution alone with respect to the alpha SiAlON. When the amount of a substance that will be a trivalent cation is set to k, Lu is trivalent, and Eu is also trivalent since $Eu_2O_3$ is generally used as a starting material, and therefore, k=p+q. Here, m and n are set to be m=3k, and n=3k/2. However, concerning the deliverable after sintering, Eu becomes divalent after being reduced, and therefore, the values of in and n may have somewhat changed accordingly.

A SiAlON phosphor having a composition in which q is 0.05 and p is 0.10~1.25 was produced as described below. Silicon nitride ($Si_3N_4$), aluminum nitride (AlN), europium oxide ($Eu_2O_3$), and lutetium oxide ($Lu_2O_3$) were used as starting materials. Table 1 shows the mass ratio of each starting material calculated according to the above design composition. These starting materials can be obtained inexpensively.

TABLE 1

COMPOSITION OF SIALON PHOSPHOR

| | DESIGN COMPOSITION | | | | UNIT OF COMPOSITE COMPOSITION: MASS % | | | |
|---|---|---|---|---|---|---|---|---|
| | p (Lu) | q (Eu) | m | n | $Si_3N_4$ | AlN | $Eu_2O_3$ | $Lu_2O_3$ |
| SAMPLE#1 | 0.100 | 0.05 | 0.450 | 0.225 | 90.38 | 4.72 | 1.50 | 3.40 |
| SAMPLE#2 | 0.150 | 0.05 | 0.600 | 0.300 | 87.30 | 6.20 | 1.48 | 5.02 |
| SAMPLE#3 | 0.200 | 0.05 | 0.750 | 0.375 | 84.30 | 7.64 | 1.46 | 6.60 |
| SAMPLE#4 | 0.250 | 0.05 | 0.900 | 0.450 | 81.39 | 9.04 | 1.44 | 8.13 |
| SAMPLE#5 | 0.300 | 0.05 | 1.050 | 0.525 | 78.56 | 10.40 | 1.42 | 9.62 |
| SAMPLE#6 | 0.350 | 0.05 | 1.200 | 0.600 | 75.80 | 11.73 | 1.40 | 11.07 |
| SAMPLE#7 | 0.400 | 0.05 | 1.350 | 0.675 | 73.13 | 13.01 | 1.38 | 12.48 |
| SAMPLE#8 | 0.450 | 0.05 | 1.500 | 0.750 | 70.52 | 14.27 | 1.36 | 13.85 |

TABLE 1-continued

COMPOSITION OF SIALON PHOSPHOR

| | DESIGN COMPOSITION | | | | UNIT OF COMPOSITE COMPOSITION: MASS % | | | |
|---|---|---|---|---|---|---|---|---|
| | p (Lu) | q (Eu) | m | n | $Si_3N_4$ | AlN | $Eu_2O_3$ | $Lu_2O_3$ |
| SAMPLE#9 | 0.500 | 0.05 | 1.650 | 0.825 | 67.98 | 15.49 | 1.34 | 15.19 |
| SAMPLE#10 | 0.650 | 0.05 | 2.100 | 1.050 | 60.76 | 18.96 | 1.29 | 18.99 |
| SAMPLE#11 | 0.950 | 0.05 | 3.000 | 1.500 | 47.84 | 25.17 | 1.20 | 25.79 |
| SAMPLE#12 | 1.250 | 0.05 | 3.900 | 1.950 | 36.64 | 30.55 | 1.12 | 31.69 |

According to this ratio, the raw material powder was weighed and mixed so that one batch equals 30 g. An n-hexane was used in the mixing process, and the mixing was performed for two hours with a wet type planetary ball mill. The powder mixture was dried with a rotary evaporator, the powder in its dried state was sufficiently broken up using a mortar, granulated to an appropriate powder diameter using a stainless steel testing sieve with a nominal mesh opening of 125 μm in compliance with JIS Z 8801, and was placed in a container with a lid of boron, nitride. The sinter temperature was set to be 1700° C., pressure was applied at 0.9 MPa in a nitrogen atmosphere, and was retained for two hours. After the sintering, in a stage being taken out of the equipment, a slight force was applied to a substance being a single lump on the mortar, the substance was broken up to a powder form, and a powder phosphor sample (SiAlON phosphor) was produced.

Incidentally, the SiAlON phosphor according to the present invention is not limited by the above production method, and can be produced with, for example, a different starting material, mixture, sieving, and sintering condition different from above. Regarding the sieving process, the nominal mesh opening of the testing sieve can be selected according to how easily the sample crumbles. Regarding the powder diameter of the powder phosphor, the emission intensity of the white light emitting diode declines significantly when the powder diameter becomes minute, for example, in the range of sub-μm to about 1 μm. In order to enhance the emission efficiency of the white light emitting diode lamp, it is indispensable to consider enhancing the efficiency of light extraction by improving the packaging design, and within the alpha SiAlON phosphor powder, it is preferable to remove and decrease the ratio of particles having a particle diameter of less than or equal to 2 μm to a ratio of less than or equal to 10%, the particles potentially being a cause of Mie scattering.

It is preferred that the sintering be performed as a gas pressurized sintering under a nitrogen atmosphere. In order to prevent oxidation and resolution during the sintering process, it is preferred that pressure is applied in addition to using a nitrogen atmosphere. In order to perform the sintering process with more reliability, it is especially preferred that the gas pressure be greater than or equal to 2 atm. It is preferred that the duration of the sintering process be 1~24 hours. It is preferred that the sintering temperature be 1650~1750° C., and a temperature of about 1700° C. is especially preferable. Regarding the solvent used to mix the raw material powder, it is preferable to use n-hexane and the like not including a hydroxyl group, because, when ethanol and the like having a hydroxyl group is used, AlN is resolved more easily.

Regarding the twelve powder phosphor samples synthesized as above, the excitation spectrum and the light emission spectrum were measured using a spectrofluorometer. Upon measuring the spectrums, a spectrofluorometer FP-6500 manufactured by JASCO was used, a spectral correction being performed on the spectrofluorometer with a rhodamine B method and a standard light source provided by the manufacturer. Assuming that an excitation by the blue LED element will occur, the light emission spectrum was measured by setting the peak excitation wavelength of the spectrofluorometer to 450 nm. The excitation spectrum was measured by setting the light emitting monitor wavelength of the spectrofluorometer to a peak emission wavelength obtained by the measurement of the light emission spectrum. Table 2 shows the values of the peak emission wavelength, the dominant wavelength, the chromaticity coordinates (x, y) in CIE1931 chromaticity diagram, and the peak emission intensity. Here, the peak emission wavelength is shown as a relative value when 100% is considered to be a peak emission intensity of a light emitting spectrum of a commercially available phosphor $(Y, Gd)_3Al_5O_{12}:Ce^{3+}$ excited at 460 nm.

TABLE 2

OPTICAL CHARACTERISTIC MEASURING RESULT OF SIALON PHOSPHOR

| | PEAK EMISSION WAVELENGTH [nm] | DOMINANT WAVELENGTH [nm] | CIE 1931 CHROMATICITY COORDINATES | | PEAK EMISSION INTENSITY (RELATIVE VALUE) |
|---|---|---|---|---|---|
| | | | x | y | |
| SAMPLE#1 | 585.7 | 579.58 | 0.4984 | 0.4794 | 36% |
| SAMPLE#2 | 586.7 | 581.92 | 0.5163 | 0.4676 | 48% |
| SAMPLE#3 | 590.0 | 583.01 | 0.5247 | 0.4620 | 60% |
| SAMPLE#4 | 592.0 | 583.79 | 0.5304 | 0.4578 | 68% |
| SAMPLE#5 | 596.7 | 585.05 | 0.5386 | 0.4504 | 68% |
| SAMPLE#6 | 597.9 | 585.60 | 0.5419 | 0.4471 | 68% |
| SAMPLE#7 | 599.9 | 586.52 | 0.5472 | 0.4414 | 64% |
| SAMPLE#8 | 600.4 | 587.17 | 0.5511 | 0.4377 | 63% |
| SAMPLE#9 | 602.7 | 587.42 | 0.5522 | 0.4360 | 60% |

TABLE 2-continued

OPTICAL CHARACTERISTIC MEASURING RESULT
OF SIALON PHOSPHOR

| | PEAK EMISSION WAVELENGTH [nm] | DOMINANT WAVELENGTH [nm] | CIE 1931 CHROMATICITY COORDINATES | | PEAK EMISSION INTENSITY (RELATIVE VALUE) |
|---|---|---|---|---|---|
| | | | x | y | |
| SAMPLE#10 | 603.5 | 588.05 | 0.5565 | 0.4326 | 59% |
| SAMPLE#11 | 608.4 | 589.55 | 0.5632 | 0.4232 | 48% |
| SAMPLE#12 | 604.5 | 588.98 | 0.5552 | 0.4245 | 31% |

Regarding the peak emission wavelength, it was possible to lengthen the wavelength to up to 608.4 nm (sample #11 (p=0.95)). The dominant wavelength has reached a range of 579.6~589.6 nm, and, excluding sample #12, the dominant wavelength has shifted to a long-wavelength as the value of p in the composition formula increases, in other words, as the amount of Lu increases. Speaking only of samples #4~#10 at $0.25 \leq p \leq 0.65$ which were determined by the measurement results of the X-ray diffraction pattern to be a single phase alpha SiAlON, the range of the dominant wavelength is 583.8~588.0 nm. In addition, the peak emission intensity of these samples #4~#10 at $0.25 \leq p \leq 0.65$ is greater than or equal to 59%, and is strong. Furthermore, the peak emission intensities of samples #4~#6 at $0.25 \leq p \leq 0.35$ are all greater than or equal to 65% (68%), and the peak emission intensity is especially strong. Thus, light emission at a long-wavelength side using a less expensive raw material compared to conventional phosphors is made possible, and it is also possible to practically realize a white light emitting device at an unprecedented low color temperature by exciting with a blue light emitting diode element.

Figure 1:
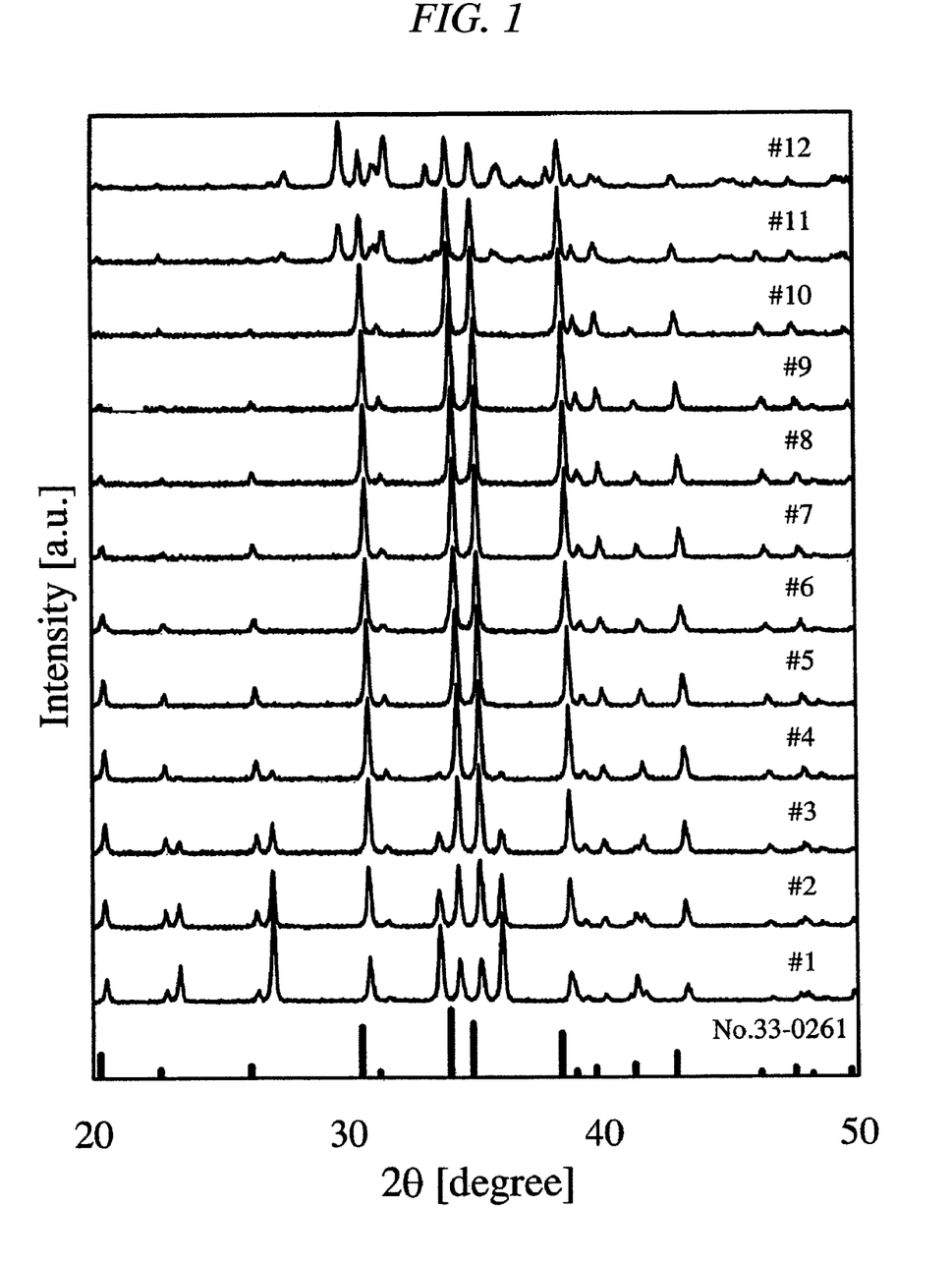
FIG. 1 is a diagram representing an X-ray diffraction pattern of a sample according to an embodiment of the present invention.
Figure 2:
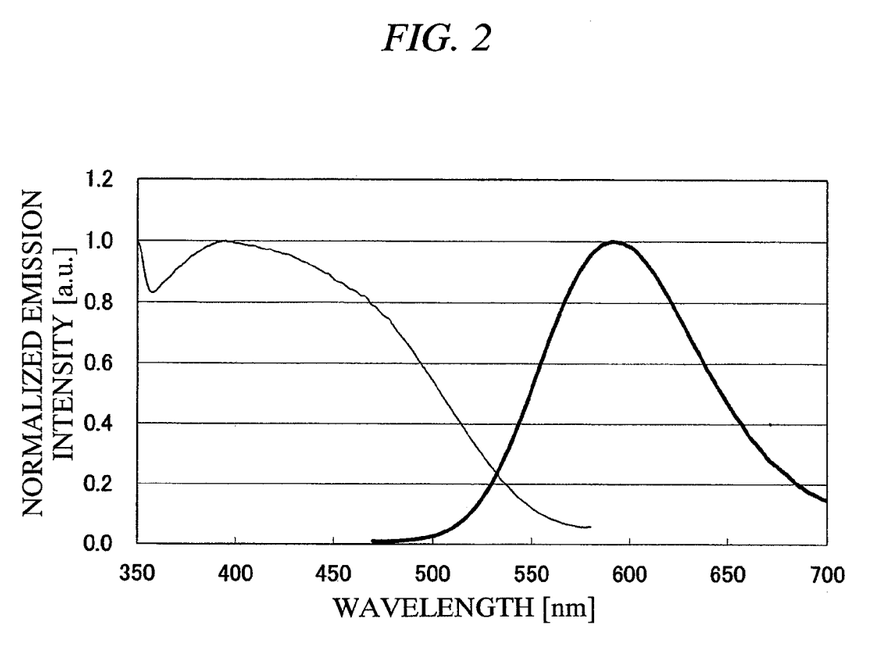
FIG. 2 represents an excitation spectrum and a light emission spectrum of sample #4. An emission intensity is normalized by setting each peak to 1. The excitation spectrum is shown by a thin line, while the light emission spectrum is shown by a bold line.
Figure 3:
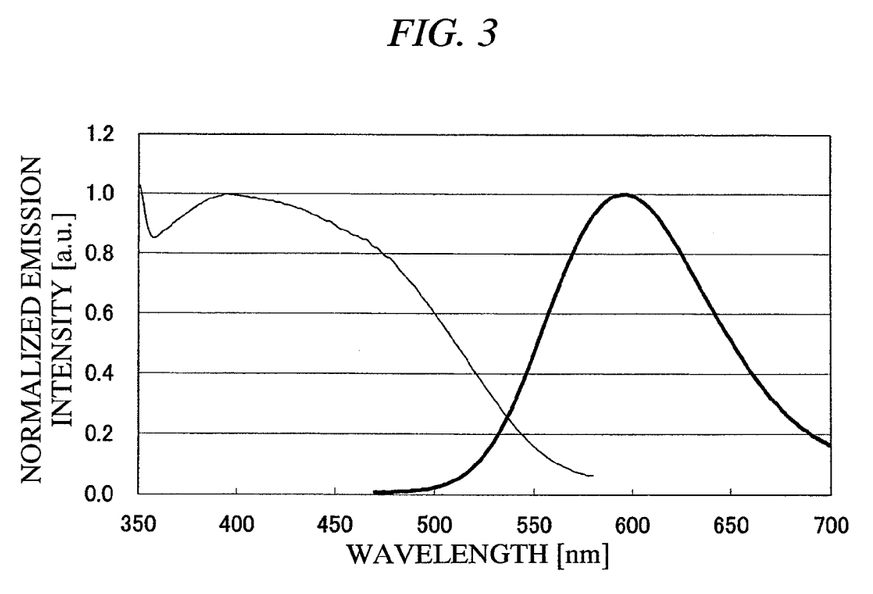
FIG. 3 represents an excitation spectrum and a light emission spectrum of sample #5. An emission intensity is normalized by setting each peak to 1. The excitation spectrum is shown by a thin line, while the light emission spectrum is shown by a bold line.
Figure 4:
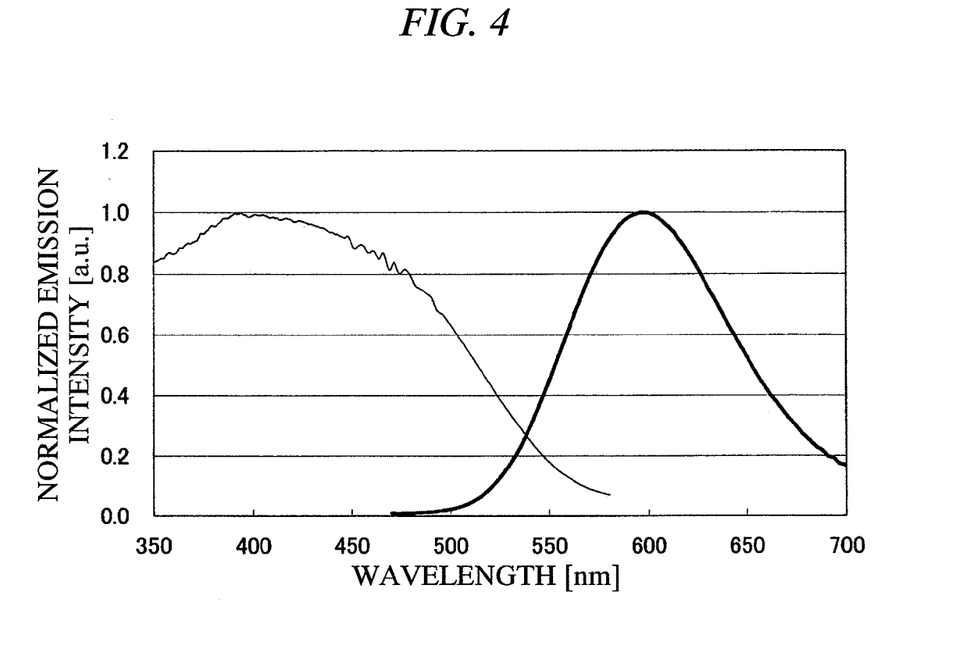
FIG. 4 represents an excitation spectrum and a light emission spectrum of sample #6. An emission intensity is normalized by setting each peak to 1. The excitation spectrum is shown by a thin line, while the light emission spectrum is shown by a bold line.
Figure 5:
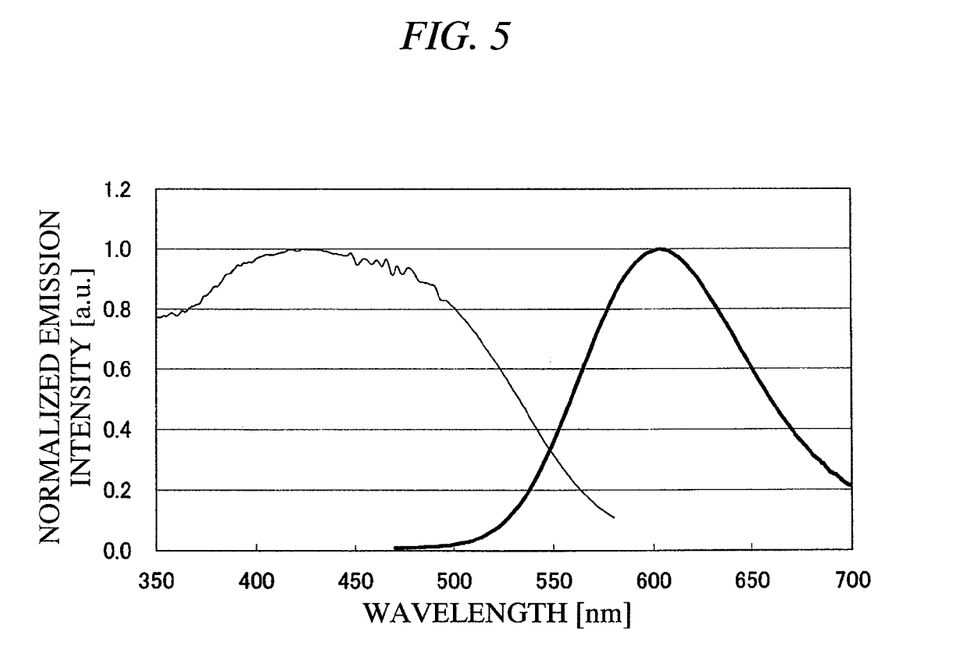
FIG. 5 represents an excitation spectrum and a light emission spectrum of sample #10. An emission intensity is normalized by setting each peak to 1. The excitation spectrum is shown by a thin line, while the light emission spectrum is shown by a bold line.

Furthermore, a powder X-ray diffraction pattern was measured for all of the twelve samples. FIG. 1 shows the measurement result and a peak position of a calcium alpha SiAlON of an X-ray data card No. 33-0261 of a PDF-2 database of a JCPDS-ICDD.

Regarding samples #1, #2, #3, #11, and #12, a creation of a second phase is observed, indicating that the samples are not a single phase alpha SiAlON, but have the crystal structure which contains an alpha SiAlON as a main phase. Regarding samples #4~#10, in other words, at $0.25 \leq p \leq 0.65$, it is observed that a crystal structure of a single phase alpha SiAlON is contained.

FIG. 2, FIG. 3, FIG. 4, and FIG. 5 represent an excitation spectrum and a light emission spectrum of samples #4, #5, #6, and #10, respectively. The emission intensity is shown in a normalized manner, setting each peak intensity to 1. All of the above can be effectively excited with an ultra violet light to a blue light, have a sufficiently wide spectrum width, and are appropriate as a phosphor for a white LED.

Figure 6:
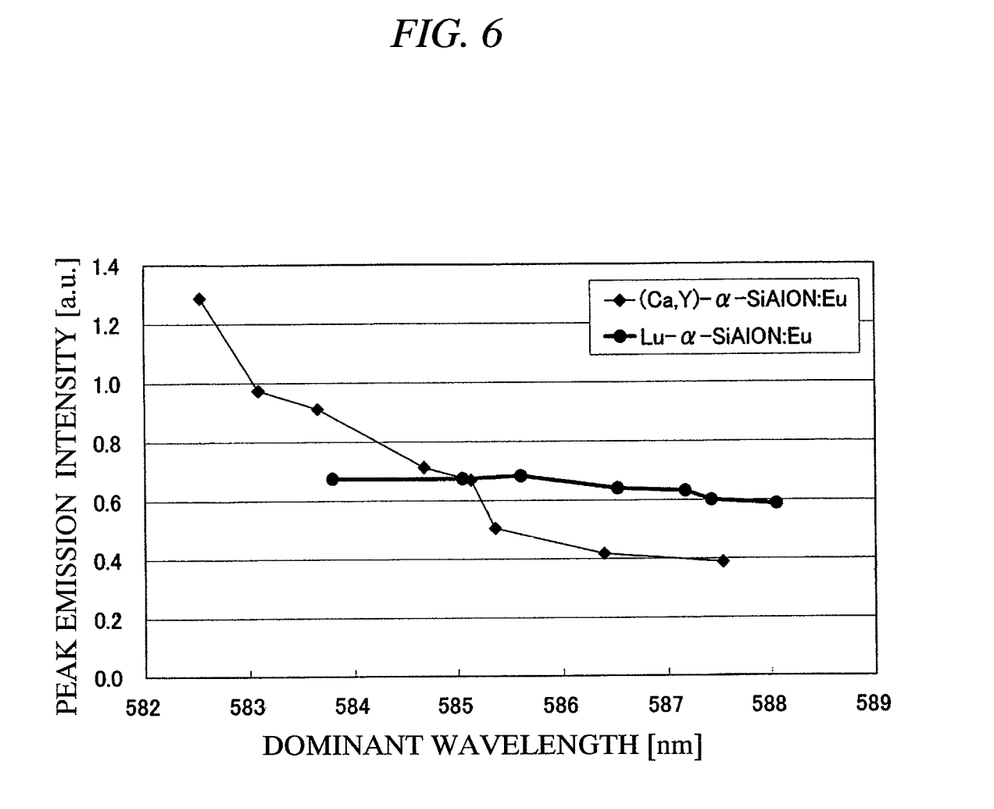
FIG. 6 is a diagram showing a relationship between a dominant wavelength and a peak emission intensity regarding samples #4~#10 and the phosphor (Ca, Y)-α-SiAlON:Eu disclosed in PCT International Publication No. WO 2006/025261.

FIG. 6 shows a relationship between the dominant wavelength and the peak emission intensity regarding the phosphor (Ca, Y)-α-SiAlON:Eu that the present inventors disclosed in Patent Document 4, and the phosphor Lu-α-SiAlON:Eu according to the present invention. Concerning the phosphor (Ca, Y)-α-SiAlON:Eu, the peak emission intensity drops rapidly as the dominant wavelength becomes longer, however, this drop hardly occurs in the phosphor Lu-α-SiAlON:Eu. In particular, when the dominant wavelength is greater than or equal to 585 nm, the peak emission intensity of the phosphor Lu-α-SiAlON:Eu is stronger compared to the peak emission intensity of the phosphor (Ca, Y)-α-SiAlON:Eu. This corresponds to samples #5~#10 at $0.3 \leq p \leq 0.65$. In the meantime, the value of q was set to q=0.05 in the present experiment, and it is preferred that q range from 0.03 to 0.08.

Figure 7:
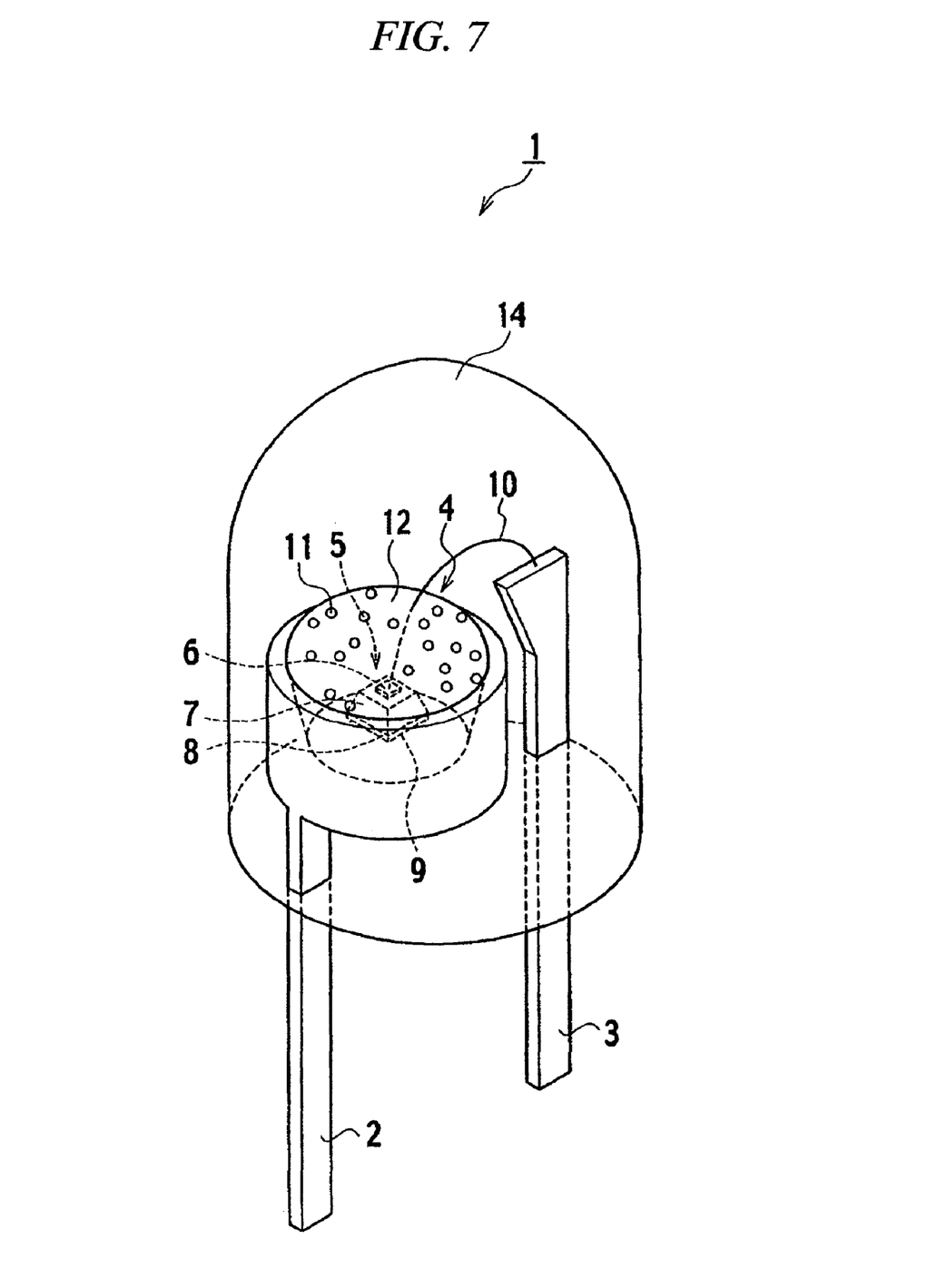
FIG. 7 is a perspective view of a light emitting device according to an aspect of the present invention.
Figure 8:
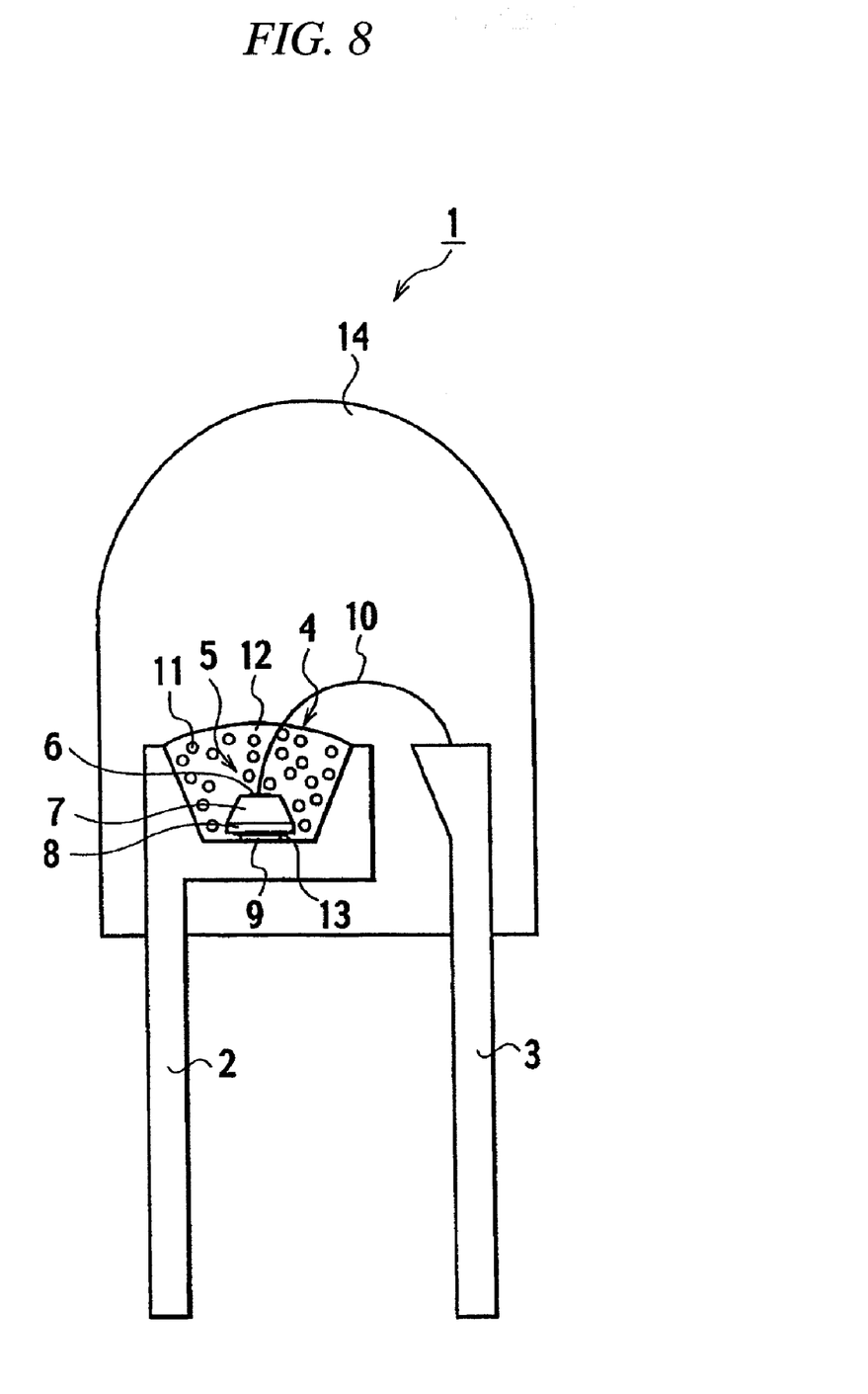
FIG. 8 is a cross sectional view of the light emitting device according to an aspect of the present invention.

FIG. 7 is a perspective view showing an embodiment of a light emitting device 1 according to the present invention using the SiAlON phosphor according to the present invention, and FIG. 8 is a cross sectional view of this light emitting device 1. The light emitting device 1 includes: an upper portion being a spherical surface having a function as a lens approximately in a tubular form, in other words, a form similar to a cannonball; lead wires 2 and 3; a blue light emitting diode element (semiconductor blue light emitting diode element) 5; a conductive paste 9; a bonding wire 10 made of gold; a SiAlON phosphor 11; a first resin 12; and a second resin 14. The blue light emitting diode element 5 includes an upper electrode 6, a silicon carbide (SiC) substrate 7, an indium gallium nitride (InGaN) light emitting layer 8, and a lower electrode 13. In addition, at an upper end part of the lead wire 2, a concaved part 4 is provided, and the lower electrode 13 of the blue light emitting diode element 5 is electrically connected to a bottom surface of the concaved part 4 with the conductive paste 9, and the upper electrode 6 is electrically connected to the lead wire 3 by the bonding wire 10.

The first resin 12 is a resin possessing transparency such as an epoxy resin, and the phosphor 11 is dispersed. This first resin, 12 is filled inside the concaved part 4, and seals the blue light emitting diode element 5. The phosphor 11 absorbs a part of a blue light emitted from the blue light emitting diode element 5, and emits a light (yellow light) with a wavelength different from the blue light. The second resin 14 is a resin possessing transparency such as an epoxy resin, and seals the upper portions of lead wires 2 and 3, the bonding wire 10, and the first resin 12. The light mating device 1 configured as above emits a white light by mixing the blue light emitted from the blue light-witting diode element 5 and the yellow light emitted from the phosphor 11.

INDUSTRIAL APPLICABILITY

The SiAlON phosphor according to the present invention can be produced inexpensively without using expensive nitride starting materials. The SiAlON phosphor according to the present invention can be used for light emitting devices such as a white light emitting diode lamp as a SiAlON phosphor that can emit light at a longer wavelength side compared to conventional phosphors.

The invention claimed is:

1. A SiAlON phosphor represented by a general formula (2)

(2)

wherein at least a main phase comprises an alpha SiAlON crystal structure;
wherein m is a numerical value represented by 3×k, and n is a numerical value represented by (3×k)/2, assuming that p+q is k; and
wherein $0.25 \leq p \leq 0.65$ and $0.03 \leq q \leq 0.08$.

2. The SiAlON phosphor as claimed in claim 1, wherein $0.25 \leq p \leq 0.35$.

3. The SiAlON phosphor as claimed in claim 1, wherein $0.30 \leq p \leq 0.65$.

4. A light emitting device comprising:
the SiAlON phosphor as claimed in claim 1, and
a semiconductor blue light emitting diode element.

5. A light emitting device comprising:
the SiAlON phosphor as claimed in claim 2, and
a semiconductor blue light emitting diode element.

6. A light emitting device comprising:
the SiAlON phosphor as claimed in claim 3, and
a semiconductor blue light emitting diode element.

* * * * *